(12) United States Patent
Casier

(10) Patent No.: US 6,288,576 B1
(45) Date of Patent: Sep. 11, 2001

(54) FAST PRE-AMPLIFIER FOR AN INTERFACE ARRANGEMENT

(75) Inventor: Herman Joris Casier, Kuurne (BE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/606,167

(22) Filed: Jun. 29, 2000

(30) Foreign Application Priority Data

Jun. 30, 1999 (EP) .................................................. 99401622

(51) Int. Cl.⁷ ...................................................... H03K 5/22
(52) U.S. Cl. ............................................. 327/65; 327/563
(58) Field of Search .................................. 327/65, 66, 63, 327/52, 53, 77, 89, 333, 560–563; 330/258, 252, 253, 255, 257, 311

(56) References Cited

U.S. PATENT DOCUMENTS

| | | | |
|---|---|---|---|
| 4,617,523 | * 10/1986 | Taylor | 330/258 |
| 5,049,761 | * 9/1991 | Zitta | 327/65 |
| 5,469,392 | * 11/1995 | Ihara | 327/66 |
| 5,726,592 | 3/1998 | Schulte et al. | 327/65 |
| 5,751,186 | * 5/1998 | Nakao | 327/562 |
| 5,764,086 | 6/1998 | Nagamatsu et al. | 327/65 |

FOREIGN PATENT DOCUMENTS 0 588 544 A2  3/1994 (EP).
43 24 649 A1  3/1994 (DE).

* cited by examiner

*Primary Examiner*—Toan Tran
(74) *Attorney, Agent, or Firm*—Sughrue, Mion, Zinn, Macpeak & Seas, PLLC

(57) ABSTRACT

An interface arrangement including the cascade connection of a differential pre-amplifier (HPA1, HPA2) and a comparator (DA), and generally known as fast Low Voltage Differential Signal [LVDS] circuit for interfacing electronic chips. The current standards for such a LVDS circuit specify a minimum switching threshold voltage for the small differential input signal, while the common mode input signal varies over a very large range, both at a very high frequency. This is achieved owing to the fact that the differential pre-amplifier comprises a first (HPA1) and a second (HPA2) half pre-amplifier, each receiving the arrangement inputs (INN, INP) in an opposite way. Each half pre-amplifier (HPA1/HPA2) having first input inverter means (NN1, PN1) coupling an input (INN/INP) to an output (OUT1/OUT2) thereof, and second input inverter means (NP1, PM1, PM2; PP1, NM1, NM2) coupling the other input (INP/INN) to the output via current mirror means (PM1, PM2; NM1, NM2). The output current of the second input inverter means is thereby inverted with respect to the output current of the first input inverter means. To obtain a controlled gain, the half pre-amplifier further includes a short-circuited inverter.

5 Claims, 2 Drawing Sheets

HPA1

US 6,288,576 B1

FAST PRE-AMPLIFIER FOR AN INTERFACE ARRANGEMENT

BACKGROUND OF THE INVENTION

The present invention relates to an interface arrangement including a very high speed pre-amplifier for operating with relatively small input signals and with high Common Mode Rejection [CMR]. More particularly, the invention relates to an interface arrangement including, between a differential pair of inputs and an output, the cascade connection of a differential pre-amplifier and a comparator.

Such an interface arrangement is generally known in the art as a fast Low Voltage Differential Signal [LVDS] circuit for interfacing electronic chips. The current standards for such a LVDS circuit specify a minimum switching threshold voltage for the small differential input signal, while the common mode input signal varies over a very large range, both at a very high frequency. Because of the small input signal, a high sensitivity is required from the interface arrangement. In the known interface arrangements, the comparator is a differential amplifier preceded by a very high-speed differential pre-amplifier with low and controlled gain. The pre-amplifier must amplify the differential signal and attenuate the common mode signal. A simple differential pair of either NMOS transistors or PMOS transistors is not able to work in this full input range. Therefore, two input differential pairs are generally put in parallel: a PMOS and a NMOS differential pair. The outputs of these two differential pairs are combined into the inputs of the comparator. Each differential pair spans a part of the input voltage range. In the middle of this voltage range both PMOS and NMOS input pairs are active, whilst for input voltages near to the ground or to the supply voltage, either only the PMOS inputs or only the NMOS inputs are active. As a consequence, the gain of the input pre-amplifier is not constant over the whole input voltage range. Traditional circuits to keep the gain constant are much too slow for complying the standard requirements and can thus not be used. Moreover, since the output of the known pre-amplifier is related to the ground or to the supply voltage, the design of the subsequent comparator or differential amplifier is more difficult. Also the offset changes between each region of operation and this has a direct impact on the signal skew.

SUMMARY OF THE INVENTION

An object of the present invention is to provide an interface arrangement of the above known type but wherein the gain is constant over the relatively large input voltage range for a relatively small input signal.

According to the invention, this object is achieved due to the fact that said differential pre-amplifier comprises a first and a second half pre-amplifier, each of said half pre-amplifiers having a first and a second input and an output connected to a distinct input of said comparator, that the first input of said first half pre-amplifier is connected to a first input of said interface arrangement and is coupled to the output of said first half pre-amplifier via first input inverter means, whilst the second input of said first half pre-amplifier is connected to the second input of said interface arrangement and is coupled to said output via second input inverter means comprising current mirror means for inverting the output current of said second input inverter means with respect to the output current of said first input inverter means, that said second half pre-amplifier is similar to said first half pre-amplifier, and that the first input of said second half pre-amplifier is connected to the second input of said interface arrangement, whilst the second input of said second half pre-amplifier is connected to the first input of said interface arrangement.

In this way, opposite currents coming from the first and from the second input inverter means are provided to the output of each half pre-amplifier. Since the two half pre-amplifiers are oppositely connected with respect to each other, a very high common mode signal attenuation is obtained. The inverter means behaves as an amplifier with the full supply voltage as input range. As a result, the large common mode range can be covered. A very high-speed is also possible owing to the low skew between the signals and the signal input range can be as wide as the full supply voltage.

Another characteristic feature of the present invention is that said first input inverter means comprises a first NMOS transistor series connected with a first PMOS transistor between a first supply terminal and a second supply terminal, the first input of said interface arrangement being connected to the gate of each of said first NMOS and first PMOS transistors, and the junction point of said series connected transistors being connected to the output of said half pre-amplifier.

The present invention is further also characterized in that said second input inverter means comprises a first and a second inverting circuit, in that said first inverting circuit comprises a second NMOS transistor series connected with a mirror input PMOS transistor between the first and the second supply terminals, in that said second inverting circuit comprises a second PMOS transistor series connected with a mirror input NMOS transistor between said first and said second supply terminals, in that the second input of said interface arrangement is connected to the gate of each of said second NMOS and second PMOS transistors, in that said second input inverter means further comprises a mirror output NMOS transistor series connected with a mirror output PMOS transistor between said first and said second supply terminals, the gate and the drain of said mirror input PMOS transistor being connected to the gate of said mirror output PMOS transistor, and the gate and the drain of said mirror input NMOS transistor being connected to the gate of said mirror output NMOS transistor, and in that the junction point of said series connected mirror output transistors being connected to the output of said half pre-amplifier.

As the NMOS and PMOS transistors behave quadratically, the sum of their gains remains constant. As a result, the gain of the interface arrangement remains constant over the full range of the input voltage.

Also another characteristic feature of the present invention is that a current source is provided between the gate of said mirror input PMOS transistor and the gate of said mirror input NMOS transistor.

This current source, located between the two diode connected mirror input transistors, prevents these transistors from switching both off when one of them is switched off at the extremes of signal input range. In other words, the current source keeps the two current mirrors active. As a result of which the speed of the Common Mode Rejection [CMR] is high.

Yet another characteristic feature of the present invention is that each of said half pre-amplifier further includes output means comprising an output NMOS transistor series connected with an output PMOS transistor between the first and the second supply terminal, the gates of said output NMOS and PMOS transistors being connected to the output of said half pre-amplifier as well as their junction point.

The complementary transistors are so forming a short-circuited inverter. This circuit is equivalent to a voltage source in series with a resistor. The resistance thereof is inversely proportional to the transconductance gain of the inverter transistors. In this way, a controlled gain can be achieved. Moreover, the dc voltage at the half pre-amplifier output is then around the mid supply voltage. This is usually better for the comparator and for the skew performance of a subsequent circuit, that may for instance be a pulse shaper.

BRIEF DESCRIPTION OF THE DRAWINGS

Further characteristic features of the present interface arrangement are mentioned in the appended claims.

The above and other objects and features of the invention will become more apparent and the invention itself will be best understood by referring to the following description of an embodiment taken in conjunction with the accompanying drawings wherein.

DETAILED DESCRIPTION OF THE INVENTION

The fast interface arrangement of the invention is a Low Voltage Differential Signal [LVDS] circuit used for interfacing electronic chips. The arrangement therefore needs to be conform to the current LVDS standards IEEE—1596.3 (1996) and TIA/EIA—644(1996), which specify a minimum switching threshold voltage of 100 mVolt for the differential input signal, while the Common Mode input signal varies from 0.0 to 2.40 Volt, for a 3.3 Volt supply voltage. Additionally, the signal speed for the current applications is 250 MHz and the Common Mode signal speed is specified up to 1 GHz.

To achieve these requirements, the interface arrangement comprises a fast pre-amplifier followed by a comparator. The pre-amplifier is adapted to amplify (=+ 10 dB) the differential input signal and to attenuate (for at least –20 dB) the common mode signal before the comparator.

Figure 1:
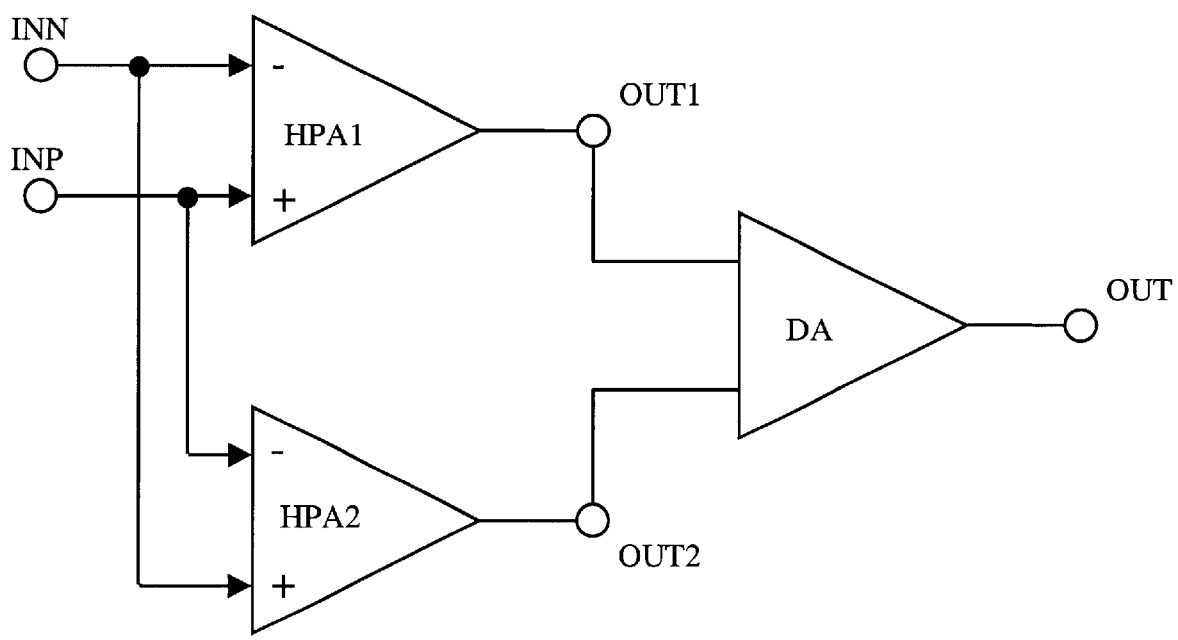
FIG. 1 represents a fast interface arrangement according to the invention.

As shown at FIG. 1, the interface arrangement has differential input terminals INN and INP and output terminal OUT. The pre-amplifier is constituted by two half pre-amplifiers HPA1 and HPA2 and is connected to a comparator DA constituted by a differential amplifier. In more detail, the input terminal INN is connected to the inverting input (–) of the half pre-amplifier HPA1 and to the non-inverting input (+) of the half pre-amplifier HPA2, whilst the input terminal INP is symmetrically connected to the non-inverting input (+) of HPA1 and to the inverting input (–) of HPA2. Output OUT1 of HPA1 is connected to an input of the comparator DA and output OUT2 of HPA2 is connected to the other input DA, the output of DA being connected to the output terminal OUT.

Each half-pre-amplifier HPA1/HPA2 is made of two parallel branches of opposite polarity: a NMOS branch and a PMOS branch. The NMOS branch of the half pre-amplifier HPA1 is for instance shown at FIG. 2. In this branch, the input terminal INN is connected to the gate of a NMOS input transistor NN1 whose source is connected to the ground Vss and whose drain is connected to the output OUT1. The input terminal INP is connected to the gate of another NMOS input transistor NP1 whose source is also connected to the ground Vss but whose drain is connected to the output OUT1 via a PMOS current mirror circuit. The current mirror circuit inverts the drain current of NP1 and is constituted by two PMOS transistors PM1 and PM2 having their gates interconnected and connected to the drain of PM1. The drain of NP1 is connected to the drain of PM1 whose source is connected to the supply terminal Vdd. The source of PM2 is also connected to Vdd and its drain is connected to the output OUT1.

Whilst the drain current of the first NMOS input transistor NN1 is directly applied to the output OUT1, the current generated by the second NMOS input transistor NP1 is inverted via the PMOS current mirror circuit PM1, PM2 and fed back into the drain of the first NMOS input transistor NN1. If the input signals INN and INP, at the two like-named input terminals, are at the same voltage, both NMOS currents cancel each other and there is no output signal at OUT1, irrespective of their common mode voltage. On the contrary, if the two input signals INN and INP differ by a differential voltage, the NMOS currents do not cancel and there is an output current available at OUT1.

Figure 2:
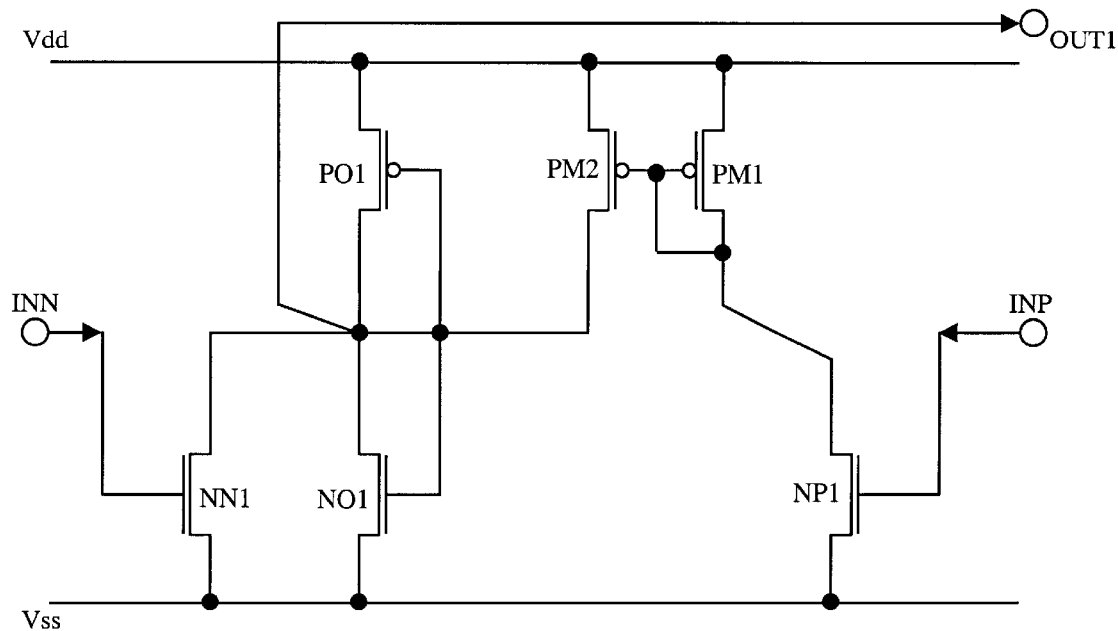
FIG. 2 shows a NMOS branch of a half pre-amplifier (HPA1) forming part of the fast interface arrangement of FIG. 1.
Figure 3:
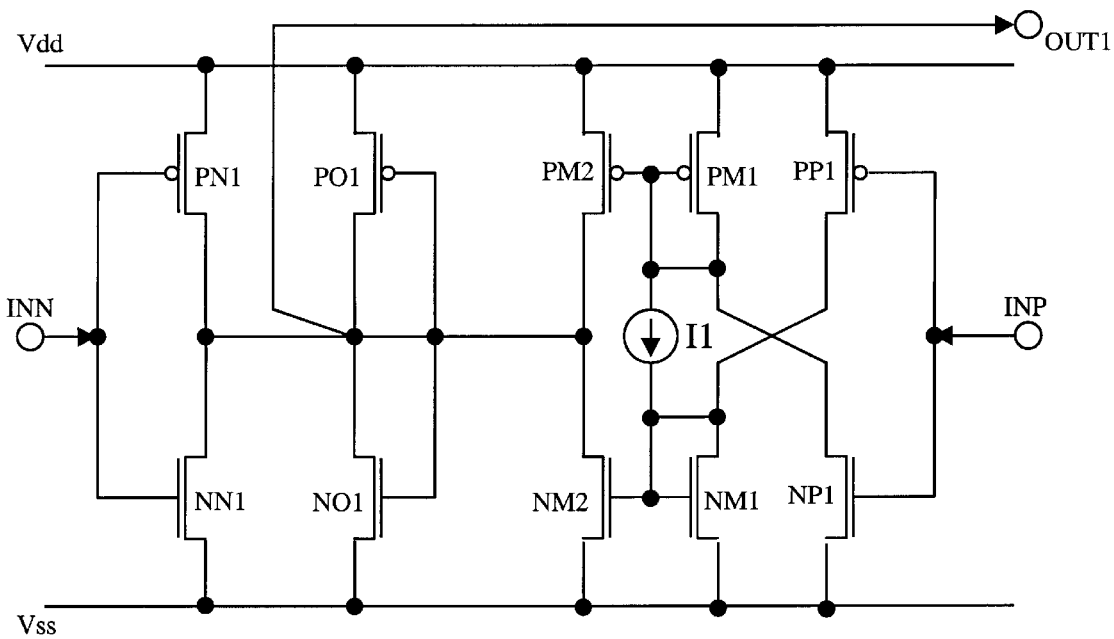
FIG. 3 shows the half pre-amplifier (HPA1) including the branch of FIG. 2.

A complementary circuit is built with PMOS transistors to form, together with the NMOS branch of FIG. 2, a full half pre-amplifier, say HPA1, as shown at FIG. 3. This complementary circuit comprises the PMOS transistors PN1 and PP1 and a NMOS current mirror circuit with NMOS transistors NM1 and NM2. The input terminals INN and INP are connected to the gates of the PMOS transistors PN1 and PP1 respectively. PN1 is connected between the supply terminal Vdd and the drain of NN1, i.e. the output terminal OUT1, whilst PP1 is connected to the supply terminal Vdd and to the output terminal OUT1 via the NMOS current mirror circuit NM1, NM2. These transistors NM1 and NM2 have their gates interconnected and connected to the drain of NM1 and their sources connected to the ground Vss. The drain of NM1 is connected to the drain of PP1, whilst the drain of NM2 is connected to the output terminal OUT1.

The series connection of the transistors NN1 and PN1 between the ground Vss and supply terminal Vdd constitutes a first input inverter for the half pre-amplifier HPA1, whilst the input transistors NP1, PP1 together with the current mirrors PM1, PM2 and NM1, NM2 constitute a second input inverter for HPA1. An input inverter is an amplifier with the full supply as input range. As a result, the large common mode range can be covered.

The input terminal INN can be seen as being connected to the inverting input (–) of the first half pre-amplifier HPA1, whilst the input terminal INP can be seen as being connected to the non-inverting input (+) of HPA1.

The output current of the combined NMOS branch and PMOS branch is converted into an output voltage OUTI at the like-named output terminal. This is performed by means of a short-circuited inverter as will be described below.

The short-circuited inverter comprises NMOS transistor NO1 and PMOS transistor P01 as shown at the FIGS. 2 and 3. These transistors are series connected between the ground Vss and supply terminal Vdd, with their junction point connected to the output terminal OUT1. The gates of NO1 and P01 are also together connected to the output terminal OUT1. A short-circuited inverter is equivalent to a voltage source in series with a resistor. The resistance is inversely proportional to the transconductance gain of the inverter transistors. As a result, a controlled gain can be achieved.

Finally, a current source 11 is added between the two diode connected transistors PM1 and NM1 of the current mirrors. This current source I1 prevents these transistors both from switching off when one of the input PMOS or NMOS transistors, PM1 or NM1, is switched off at the extremes of signal input range. In other words, the current source I1 keeps the current mirrors active and thereby keeps the speed of the Common Mode Rejection [CMR] high.

It is to be noted that the W/L of the transistors NO1 and PO1 forming the short-circuited inverter is smaller than that of the NMOS and PMOS input transistors NN1, NP1, PN1 and PP1 mentioned above. The ratio of these W/Ls controls the differential gain of the half pre-amplifier HPA1.

To form the whole pre-amplifier of the interface arrangement, the second half pre-amplifier HPA2 is added to HPA1 with both input terminals INN and INP exchanged. The half pre-amplifier HPA2 is identical to HPA1. As a result, HPA2 has the same common mode output voltage value and the inverse differential output voltage as HPA1. In more detail, and referring again to FIG. 1, the input terminal INN of the interface arrangement is connected to the inverting input (−) of the first half pre-amplifier HPA1 and to the non-inverting input (+) of the second half pre-amplifier HPA2, whilst the input terminal INP of the arrangement is connected to the non-inverting input (+) of HPA1 and to inverting input (−) of HPA2. As already mentioned, the two complementary outputs OUT1 and OUT2 of respectively HPA1 and HPA2 are fed to the differential comparator DA.

Since the PMOS and NMOS transistors of the pre-amplifiers behave quadratically, the sum of their gains remains constant. The gain of the interface arrangement thus remains constant over the full input range. The present interface arrangement also works for low supply voltages, as long as the supply voltage Vdd remains larger than $Vt_N + Vt_P + 2*(Vgs-Vt)$, where Vt is the threshold voltage, $Vt_N$ and $Vt_P$ respectively for the NMOS and the PMOS transistors, and Vgs is the gate-to-source voltage of these transistors.

While the principles of the invention have been described above in connection with specific apparatus, it is to be clearly understood that this description is made only by way of example and not as a limitation on the scope of the invention, as defined in the appended claims.

What is claimed is:

1. An interface arrangement including, between a differential pair of inputs and an interface output, the cascade connection of a differential pre-amplifier and a comparator, wherein
   said differential pre-amplifier comprises a first and a second half pre-amplifier, each of said half pre-amplifiers having a first and a second input and an output connected to a distinct input of said comparator,
   the first input of said first half pre-amplifier is connected to a first input of said interface arrangement and is coupled to the output of said first half pre-amplifier via first a input inverter, whilst the second input of said first half pre-amplifier is connected to the second input of said interface arrangement and is coupled to said output via a second input inverter comprising a current mirror for inverting the output current of said second input inverter with respect to the output current of said first input inverter,
   said second half pre-amplifier is similar to said first half pre-amplifier, the first input of said second half pre-amplifier is connected to the second input of said interface arrangement, whilst the second input of said second half pre-amplifier is connected to the first input of said interface arrangement, and
   said first input inverter comprises a first NMOS transistor series connected with a first PMOS transistor between a first supply terminal and a second supply terminal, the first input of said interface arrangement being connected to the gate of each of said first NMOS and first PMOS transistors, and the junction point of said series connected transistors being connected to the output of said half pre-amplifier.

2. An interface arrangement including, between a differential pair of inputs and an interface output, the cascade connection of a differential pre-amplifier and a comparator, wherein
   said differential pre-amplifier comprises a first and a second half pre-amplifier, each of said half pre-amplifiers having a first and a second input and an output connected to a distinct input of said comparator,
   the first input of said first half pre-amplifier is connected to a first input of said interface arrangement and is coupled to the output of said first half pre-amplifier via first a input inverter, whilst the second input of said first half pre-amplifier is connected to the second input of said interface arrangement and is coupled to said output via a second input inverter comprising a current mirror for inverting the output current of said second input inverter with respect to the output current of said first input inverter,
   said second half pre-amplifier is similar to said first half pre-amplifier,
   the first input of said second half pre-amplifier is connected to the second input of said interface arrangement, whilst the second input of said second half pre-amplifier is connected to the first input of said interface arrangement,
   said second input inverter comprises a first and a second inverting circuit,
   said first inverting circuit comprises a second NMOS transistor series connected with a mirror input PMOS transistor between a first supply terminal and a second supply terminal,
   said second inverting circuit comprises a second PMOS transistor series connected with a mirror input NMOS transistor between said first and said second supply terminals,
   the second input of said interface arrangement is connected to the gate of each of said second NMOS and second PMOS transistors,
   said second input inverter further comprises a mirror output NMOS transistor series connected with a mirror output PMOS transistor between said first and said second supply terminals, the gate and the drain of said mirror input PMOS transistor being connected to the gate of said mirror output PMOS transistor, and the gate and the drain of said mirror input NMOS transistor being connected to the gate of said mirror output NMOS transistor, and
   the junction point of said series connected mirror output transistors being connected to the output of said half pre-amplifier.

3. An interface arrangement according to claim 2, characterized in that a current source is provided between the gate of said mirror input PMOS transistor and the gate of said mirror input NMOS transistor.

4. An interface arrangement including, between a differential pair of inputs and an interface output, the cascade connection of a differential pre-amplifier and a comparator, wherein
   said differential pre-amplifier comprises a first and a second half pre-amplifier, each of said half pre-amplifiers having a first and a second input and an output connected to a distinct input of said comparator, the first input of said first half pre-amplifier is connected to a first input of said interface arrangement and is coupled to the output of said first half pre-amplifier via first a input inverter, whilst the second input of said first half pre-amplifier is connected to the second input of said interface arrangement and is coupled to said output via a second input inverter comprising a current mirror for inverting the output current of said second input inverter with respect to the output current of said first input inverter, said second half pre-amplifier is similar to said first half pre-amplifier, the first input of said second half pre-amplifier is connected to the second input of said interface arrangement, whilst the second input of said second half pre-amplifier is connected to the first input of said interface arrangement, and each of said half pre-amplifier further includes an output NMOS transistor series connected with an output PMOS transistor between a first supply terminal and a second supply terminal, the gates of said output NMOS and PMOS transistors being connected to the output of said half pre-amplifier as well as their junction point.

5. An interface arrangement according to any one of claims 1, 2 or 3, characterized in that said first supply terminal is at ground and in that said second supply terminal is at the supply voltage.

* * * * *